US010868245B1

(12) United States Patent
Bai et al.

(10) Patent No.: US 10,868,245 B1
(45) Date of Patent: Dec. 15, 2020

(54) PHASE CHANGE MEMORY DEVICE WITH CRYSTALLIZATION TEMPLATE AND METHOD OF MAKING THE SAME

(71) Applicant: SANDISK TECHNOLOGIES LLC, Addison, TX (US)

(72) Inventors: Zhaoqiang Bai, San Jose, CA (US); Mac Apodaca, San Jose, CA (US); Michael Grobis, San Jose, CA (US); Michael Nicolas Albert Tran, San Jose, CA (US); Neil Leslie Robertson, Palo Alto, CA (US); Gerardo Bertero, Redwood City, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/432,356

(22) Filed: Jun. 5, 2019

(51) Int. Cl.
*H01L 45/00* (2006.01)
*H01L 27/24* (2006.01)
*G11C 13/00* (2006.01)

(52) U.S. Cl.
CPC .......... *H01L 45/06* (2013.01); *G11C 13/0004* (2013.01); *G11C 13/0069* (2013.01); *H01L 27/2427* (2013.01); *H01L 45/1233* (2013.01); *H01L 45/1253* (2013.01); *H01L 45/144* (2013.01); *H01L 45/146* (2013.01); *H01L 45/1608* (2013.01)

(58) Field of Classification Search
CPC ... H01L 45/06; H01L 45/065; H01L 45/1233; H01L 45/144; G11C 13/0004
See application file for complete search history.

(56) References Cited

U.S. PATENT DOCUMENTS

| 8,803,119 B2 * | 8/2014 | Morikawa ........... H01L 45/1683 257/2 |
| 10,050,194 B1 | 8/2018 | Nardi et al. |
| 10,199,434 B1 | 2/2019 | Lee et al. |
| 10,249,683 B1 | 4/2019 | Lille et al. |

(Continued)

FOREIGN PATENT DOCUMENTS

| CN | 108987567 A | 12/2018 |
| KR | 10-2007-0103480 A | 10/2007 |

OTHER PUBLICATIONS

Sebastian, A. et al., "Crystal growth within a phase change memory cell," Nature Communications, 5:4314 (2014), DOI: 10.1038/ncomms5314.

(Continued)

*Primary Examiner* — Allison Bernstein
(74) *Attorney, Agent, or Firm* — The Marbur Law Group PLLC (57) ABSTRACT

A phase change memory device includes a phase change material portion located between a first electrode and a second electrode, and a crystallization template material portion located between the first electrode and the second electrode in contact with the phase change material portion. The crystallization template material portion and the phase change material portion belong to a same crystal system and have matching lattice spacing, or the crystallization template material portion and the phase change material portion do not belong to the same crystal system, but have a matching translational symmetry along at least one paired lattice plane with a matching lattice spacing.

18 Claims, 8 Drawing Sheets

(56) References Cited

U.S. PATENT DOCUMENTS

| | | | |
|---|---|---|---|
| 2007/0164309 A1 | 7/2007 | Kumar et al. | |
| 2009/0278107 A1* | 11/2009 | Kim | H01L 45/143 257/2 |
| 2012/0134204 A1 | 5/2012 | Happ et al. | |
| 2014/0070155 A1 | 3/2014 | Cohen et al. | |

OTHER PUBLICATIONS

Salinga, M. et al., "Measurement of crystal growth velocity in a melt-quenched phase-change material," Nature Communications, 4:2371 (2013), DOI: 10.1038/ncomms3371.

Bragalia, V. et al., "Structural change upon annealing of amorphous $Ge_2Sb_2Te_5$ grown on Si(111)," Journal of Applied Physics, vol. 116, 054913 (2014).

Orava, J. et al., "Characterization of supercooled liquid $Ge_2Sb_2Te_5$ and its crystallization by ultrafast-heating calorimetry," Nature Materials Letters, vol. 11, p. 279, Apr. 2012.

Woods, Z. et al., "Modeling of Phase-Change Memory: Nucleation, Growth, and Amorphization Dynamics During Set and Reset: Part I—Effective Media Approximation," IEEE Transactions on Electron Devices, vol. 64, No. 11, Nov. 2017.

Lee, B.S. et al., "Distribution of nanoscale nuclei in the amorphous dome of a phase change random access memory," Appl. Phys. Lett., vol. 104, 071907 (2014).

Burr, G.W. et al., "Observation and modeling of polycrystalline grain formation in $Ge_2Sb_2Te_5$," Journal of Applied Physics, vol. 111, 104308 (2012).

Noe, P. et al., "Impact of interfaces on scenario of crystallization of phase change materials," Acta Materialla, vol. 110 (2016), pp. 142-148.

U.S. Appl. No. 15/844,005, filed Dec. 15, 2017, SanDisk Technologies LLC.

U.S. Appl. No. 15/898,571, filed Feb. 17, 2018, SanDisk Technologies LLC.

U.S. Appl. No. 15/901,633, filed Feb. 21, 2018, SanDisk Technologies LLC.

U.S. Appl. No. 15/924,944, filed Mar. 19, 2018, SanDisk Technologies LLC.

U.S. Appl. No. 15/996,738, filed Jun. 4, 2018, SanDisk Technologies LLC.

U.S. Appl. No. 16/002,169, filed Jun. 7, 2018, SanDisk Technologies LLC.

U.S. Appl. No. 16/002,243, filed Jun. 7, 2018, SanDisk Technologies LLC.

U.S. Appl. No. 16/019,745, filed Jun. 27, 2018, SanDisk Technologies LLC.

U.S. Appl. No. 16/021,694, filed Jun. 28, 2018, SanDisk Technologies LLC.

Notification of Transmittal of the International Search Report and Written Opinion of the International Search Authority for International Patent Application No. PCT/US2020/021848, dated Jul. 6, 2020, 12 pages.

* cited by examiner

PHASE CHANGE MEMORY DEVICE WITH CRYSTALLIZATION TEMPLATE AND METHOD OF MAKING THE SAME

FIELD

The present disclosure relates generally to the field of semiconductor devices and specifically to a memory device including phase change memory cells with crystallization templates and methods of forming the same.

BACKGROUND

A phase change material (PCM) memory device (also known as a phase change random access memory "PCRAM" or "PRAM") is a type of non-volatile memory device that stores information as a resistivity state of a material that can be in different resistivity states corresponding to different phases of the material. The different phases can include an amorphous state having high resistivity and a crystalline state having low resistivity (i.e., a lower resistivity than in the amorphous state). The transition between the amorphous state and the crystalline state can be induced by controlling the rate of cooling after application of an electrical pulse that renders the phase change material amorphous in a first part of a programming process. The second part of the programming process includes control of the cooling rate of the phase change material. If rapid quenching occurs, the phase change material can cool into an amorphous high resistivity state. If slow cooling occurs, the phase change material can cool into a crystalline low resistivity state.

SUMMARY

According to an aspect of the present disclosure, a phase change memory device includes a phase change material portion located between a first electrode and a second electrode, and a crystallization template material portion located between the first electrode and the second electrode in contact with the phase change material portion. The crystallization template material portion and the phase change material portion belong to a same crystal system and have matching lattice spacing, or the crystallization template material portion and the phase change material portion do not belong to the same crystal system, but have a matching translational symmetry along at least one paired lattice plane with a matching lattice spacing.

According to another aspect of the present disclosure, a method of operating the phase change memory device of comprising a phase change material portion located between a first electrode and a second electrode, includes programming the phase change material portion in a RESET operation to convert a crystalline first region of the phase change material portion into a higher resistivity amorphous state, while at least one second region of the phase change material portion remains in a crystalline state, and programming the phase change material portion in a SET operation to crystallize the amorphous first region of the phase change material back into the crystalline state using the at least one crystalline second region of the phase change material as a crystallization template.

According to another aspect of the present disclosure, a method of forming a phase change memory device is provided, which comprises: forming a first electrode comprising a first conductive material; forming a pillar structure including combination of a phase change material portion comprising a phase change material and a crystallization template material portion in contact with the phase change material portion on the first electrode, wherein the crystallization template material portion comprises a crystallization template material having a higher melting point or a higher decomposition temperature than the phase change material; forming a dielectric matrix layer over the first electrode and around the pillar structure; and forming a second electrode over the pillar structure.

DETAILED DESCRIPTION

Embodiments of the present disclosure are directed to a memory device including phase change memory cells with crystallization templates and methods of forming the same, the various aspects of which are described below. The memory devices of embodiments of the present disclosure can be used in storage class memory systems.

Generally, programming of a phase change material from a high (i.e., higher) resistivity amorphous state into a low (i.e., lower) resistivity crystalline state (i.e., a "SET" operation) can be difficult and energy-intensive. Crystallization of many phase change materials (such as germanium-antimony-telluride compound semiconductor materials) is nucleation-dominated. Nucleation of the phase change material into a crystalline state having large grain sizes becomes increasingly difficult as the volume size of phase change materials is reduced. This problem is exacerbated as the size of phase change memory cells decrease to dimensions less than 80 nm. Using a longer SET time or a growth-from-melt type SET operation may lead to slow write speed and high energy consumption in a phase change memory device, and thus, is not desirable. Embodiments of the present disclosure provide crystallization templates that improve the crystallization of the phase change material into the crystalline, low resistivity SET state, such as for example when the smallest dimension of the phase change memory cell is less than 80 nm, such as 25 to 80 nm.

The drawings are not drawn to scale. Multiple instances of an element may be duplicated where a single instance of the element is illustrated, unless absence of duplication of elements is expressly described or clearly indicated otherwise. Unless otherwise indicated, a "contact" between elements refers to a direct contact between elements that provides an edge or a surface shared by the elements. Ordinals such as "first," "second," and "third" are employed merely to identify similar elements, and different ordinals may be employed across the specification and the claims of the instant disclosure. A same reference numeral refers to a same element or a similar element. Unless otherwise noted, elements with a same reference numeral are presumed to have a same material composition. As used herein, all thermoelectric properties and thermal properties are measured at 300 degrees Celsius unless otherwise specified. Consequently, the reference temperature (i.e., measurement temperature) for asymmetric thermoelectric heat generation and other thermoelectrical properties and thermal properties is 300 degrees Celsius in the specification and in the claims unless expressly specified otherwise.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from $1.0 \times 10^{-3}$ S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{2}$ S/cm. As used herein, an "insulator material" or a "dielectric material" refers to a material having electrical conductivity much less than $1.0 \times 10^{-3}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{2}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-3}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

Figure 1A:
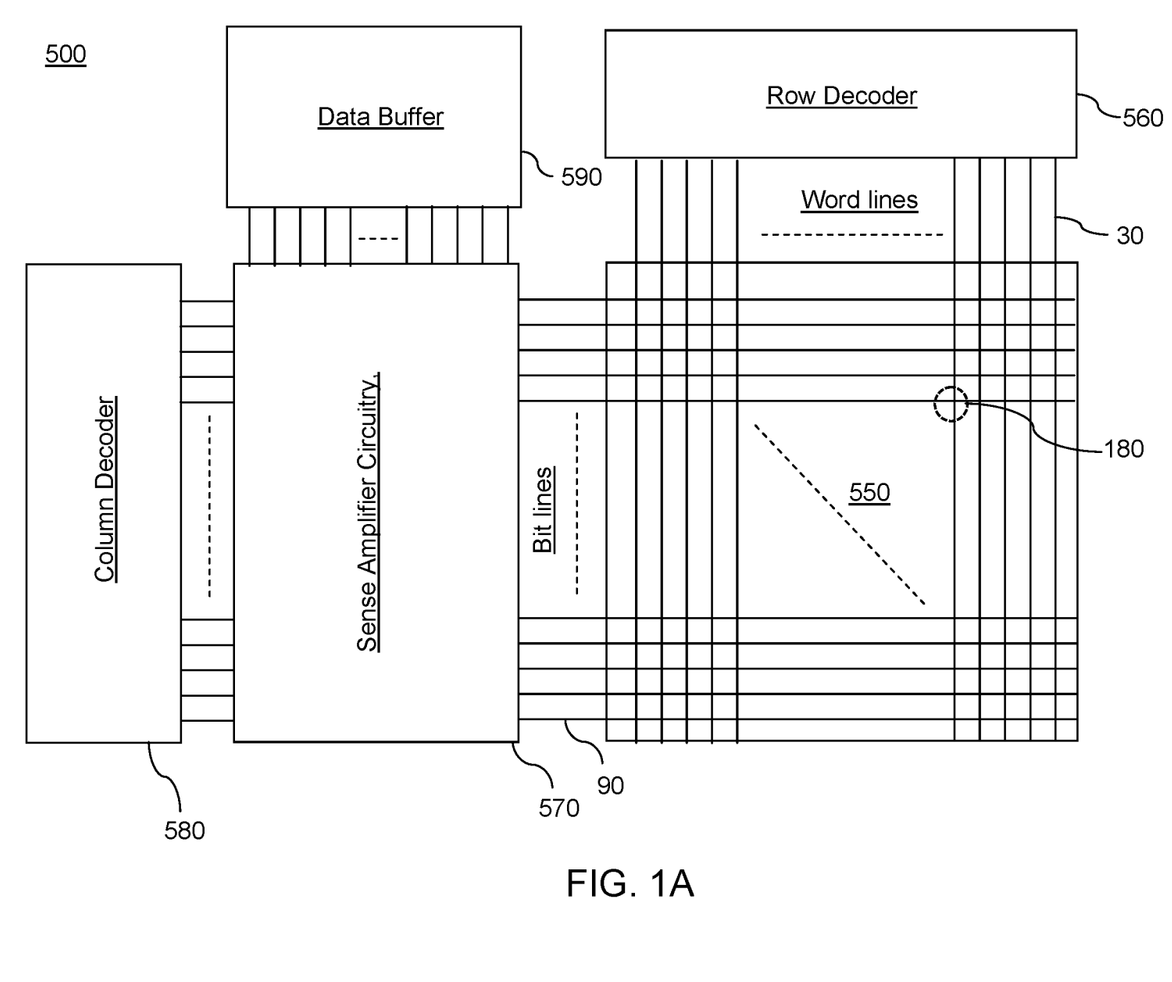
FIG. 1A is an exemplary circuit schematic of a phase change memory device including a two-dimensional or a three-dimensional array of phase change memory elements of the present disclosure.

Referring to FIG. 1A, a schematic diagram is shown for a phase change memory device 500 including phase change memory cells 180 in an array configuration. As used herein, a phase change memory device refers to a memory device that employs a phase change material providing at least two resistivity states, such as a combination of a high (i.e., higher) resistivity amorphous state and a low (i.e., lower) resistivity crystalline (e.g., polycrystalline) state. The phase change memory device can be configured as a random access memory device. As used herein, a "random access memory device" refers to a memory device including memory cells that allow random access, i.e., access to any selected memory cell upon a command for reading the contents of the selected memory cell.

The phase change memory device 500 of an embodiment of the present disclosure includes a memory array region 550 containing an array of phase change memory cells 180 located at the intersection of the respective word lines 30 and bit lines 90. The phase change memory device 500 may also contain a row decoder 560 connected to the word lines 30, a programming and sensing circuitry 570 (e.g., a sense amplifier and other bit line control circuitry) connected to the bit lines 90, a column decoder 580 connected to the bit lines 90 and a data buffer 590 connected to the sense circuitry. Multiple instances of the phase change memory cells 180 are provided in an array configuration in the phase change memory device 500.

Figure 1B:
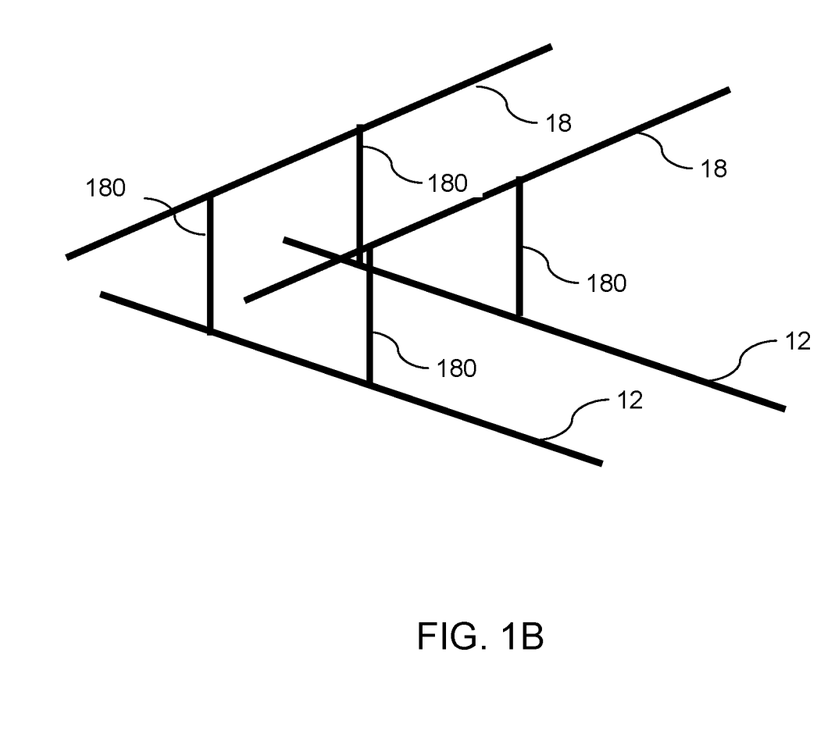
FIG. 1B is a schematic illustrating a configuration of a cross-point array of word lines and bit lines in the phase change memory device of FIG. 1A.

FIG. 1B illustrates a cross-point array configuration for a group of phase change memory cells 180. Each phase change memory cell 180 includes a phase change material having at least two different resistivity states. The phase change material portion is provided between a first electrode 12 and a second electrode 18. A plurality of first electrodes 12 comprise a first set of parallel metal lines extending along a first horizontal direction (e.g., word line direction), and a plurality of second electrodes 18 comprise a second set of parallel metal lines extending along a second horizontal direction (e.g., bit line direction). The second horizontal direction may, or may not, be perpendicular to the first horizontal direction. In one embodiment, the first electrodes 12 may comprise the word lines 30, and the second electrodes 18 may comprise the bit lines 90. Alternatively, the first electrodes 12 may comprise the bit lines 90, and the second electrodes 18 may comprise the word lines 30.

Figure 2:
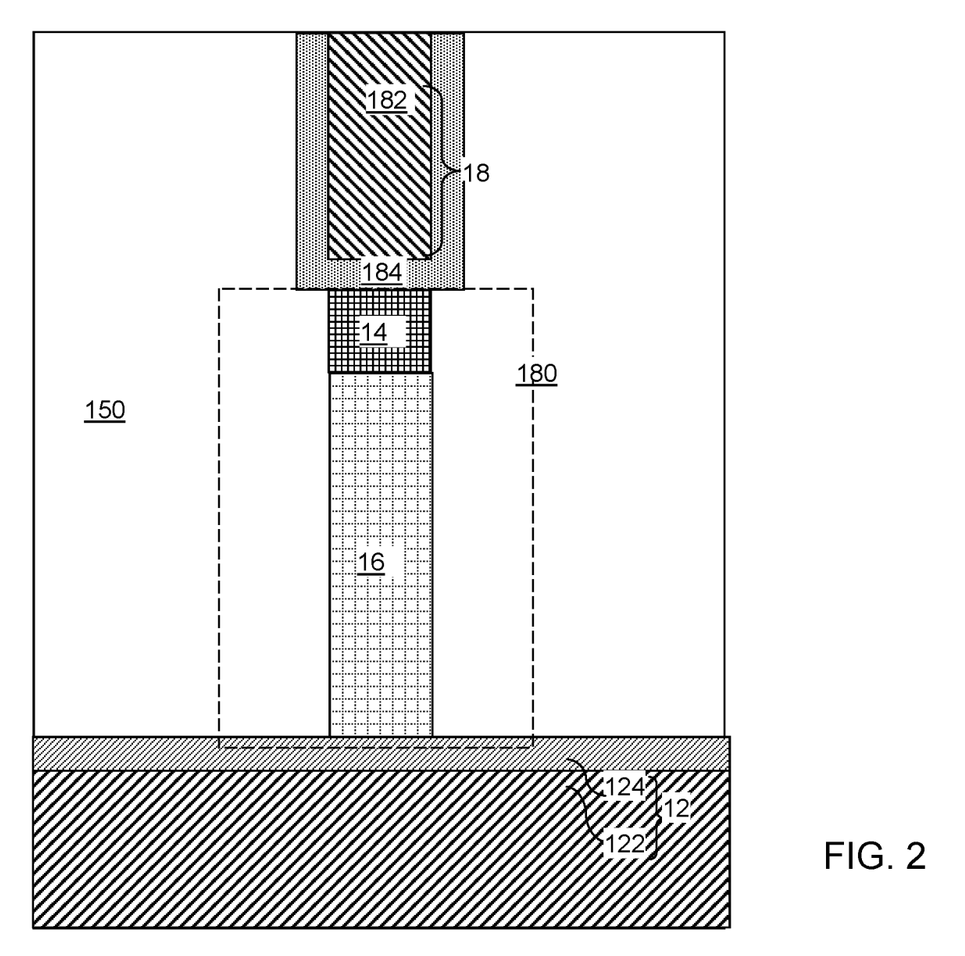
FIG. 2 is a vertical cross-sectional view of a first exemplary phase change memory cell according to an embodiment of the present disclosure.

Referring to FIG. 2, a first exemplary structure including a phase change memory cell 180 according to a first embodiment of the present disclosure is illustrated. In the first embodiment, one or more regions of the phase change material can be used as a crystallization template for the amorphous region of the phase change material during the SET operation. A first electrode 12 is formed over an insulating surface, which may be a surface of an insulating material layer (not shown) deposited over a substrate (not shown). The first electrode 12 includes at least one conductive material. For example, the first electrode 12 can include a layer stack of a first conductive material rail 122 and a first diffusion barrier liner 124. The first conductive material rail 122 can include a metal, such as tungsten or copper. The thickness of the first conductive material rail 122 can be in a range from 20 nm to 200 nm, such as from 30 nm to 100 nm, although lesser and greater thicknesses can also be employed. The width of the first conductive material rail 122 can be in a range from 20 nm to 200 nm, such as from 30 nm to 100 nm, although lesser and greater widths can also be employed. The first diffusion barrier liner 124 includes a diffusion barrier material such as a conductive metallic nitride (such as TiN, TaN, and/or WN) and/or a conductive carbon-based material. The thickness of the first diffusion barrier liner 124 can be in a range from 1 nm to 10 nm, such as from 1.5 nm to 5 nm, although lesser and greater thicknesses can also be employed. The width of the first diffusion barrier liner 124 can be the same as the width of the first conductive material rail 122. In one embodiment, a plurality of first electrodes 12 may be formed as parallel metallic line structures. In this case, inter-electrode insulating material strips (such as silicon oxide strips) may be provided between the plurality of first electrodes 12 such that the plurality of first electrodes 12 and the inter-electrode insulating material strips form a laterally alternating sequence that alternates along a direction (e.g., the second horizontal direction) which is perpendicular to the lengthwise directions (e.g., the first horizontal direction) of the first electrodes 12 and the inter-electrode insulating material strips.

A phase change material layer and an optional selector material layer can be deposited over the at least one first electrode 12 in either order (e.g., the selector material layer may be deposited above or below the phase change material layer). Optional additional layers, such as an intermediate conductive barrier layer may be formed between the phase change material layer and the selector material layer and/or above and/or below these layers. The phase change material layer includes a phase change material. As used herein, a "phase change material" refers to a material having at least two different phases providing different resistivity. The at least two different phases can be provided, for example, by controlling the time-dependent temperature profile during a cooling step that follows a heated state to provide an amorphous state having a higher resistivity and a polycrystalline state having a lower resistivity. In this case, the higher resistivity state of the phase change material can be achieved by faster quenching of the phase change material after heating the polycrystalline material to an amorphous solid state and/or to a liquid state, and the lower resistivity state of the phase change material can be achieved by heating the amorphous material followed by controlled cooling of the phase change material from the amorphous state to the polycrystalline state. The phase change material acts as the memory material (i.e., data storage material).

Exemplary phase change materials include, but are not limited to, germanium antimony telluride (GST) compounds such as $Ge_2Sb_2Te_5$ or $GeSb_2Te_4$, germanium antimony compounds, indium germanium telluride compounds, aluminum selenium telluride compounds, indium selenium telluride compounds, and aluminum indium selenium telluride compounds. These compounds (e.g., compound semiconductor material) may be doped (e.g., nitrogen doped GST) or undoped. Thus, the phase change material layer can include, and/or can consist essentially of, a material selected from a germanium antimony telluride compound, a germanium antimony compound, an indium germanium telluride compound, an aluminum selenium telluride compound, an indium selenium telluride compound, or an aluminum indium selenium telluride compound. The thickness of the phase change material layer can be in a range from 10 nm to 600 nm, such as from 20 nm to 300 nm and/or from 40 nm to 150 nm, although lesser and greater thicknesses can also be employed.

The optional selector material layer includes a non-Ohmic material that provides electrical connection of electrical isolation depending on the magnitude and/or the polarity of an externally applied voltage bias thereacross. In one embodiment, the selector material layer includes at least one threshold switch material layer. The threshold switch material layer can include any suitable threshold switch material which exhibits non-linear electrical behavior, such as an ovonic threshold switch (OTS) material or volatile conductive bridge. In addition, non-thresholding selectors such as a diode switch material (e.g., materials for p-n semiconductor diode, p-i-n semiconductor diode, Schottky diode or metal-insulator-metal diode) or tunneling selector can be used. As used herein, an ovonic threshold switch is a device that does not crystallize in a low resistivity state under a voltage above the threshold voltage, and reverts back to a high resistivity state when not subjected to a voltage above a critical holding voltage across the OTS material layer. As used herein, an "ovonic threshold switch material" refers to a material that displays a non-linear resistivity curve under an applied external bias voltage such that the resistivity of the material decreases with the magnitude of the applied external bias voltage. In other words, an ovonic threshold switch material is non-Ohmic, and becomes more conductive under a higher external bias voltage than under a lower external bias voltage.

An ovonic threshold switch material (OTS material) can be non-crystalline (for example, amorphous) in a high resistivity state, and can remain non-crystalline (for example, remain amorphous) in a low resistivity state during application of a voltage above its threshold voltage across the OTS material. The OTS material can revert back to the high resistivity state when the high voltage above its threshold voltage is lowered below a critical holding voltage. Throughout the resistivity state changes, the ovonic threshold switch material can remain non-crystalline (e.g., amorphous). In one embodiment, the ovonic threshold switch material can comprise a chalcogenide material which exhibits hysteresis in both the write and read current polarities. The chalcogenide material may be a GeTe compound or a Ge—Se compound doped with a dopant selected from As, N, and C, such as a Ge—Se—As compound semiconductor material. The ovonic threshold switch material layer can contain any ovonic threshold switch material. In one embodiment, the ovonic threshold switch material layer can include, and/or can consist essentially of, a GeSeAs alloy, a GeTeAs, a GeSeTeSe alloy, a GeSe alloy, a SeAs alloy, a GeTe alloy, or a SiTe alloy.

In one embodiment, the material of the selector material layer can be selected such that the resistivity of the selector material therein decreases at least by two orders of magnitude (i.e., by more than a factor of 100) upon application of an external bias voltage that exceeds a critical bias voltage magnitude (also referred to as threshold voltage). In one embodiment, the composition and the thickness of the selector material layer can be selected such that the critical bias voltage magnitude can be in a range from 1 V to 6 V, although lesser and greater voltages can also be employed for the critical bias voltage magnitude. The thickness of the selector material layer can be, for example, in a range from 1 nm to 50 nm, such as from 5 nm to 25 nm, although lesser and greater thicknesses can also be employed.

The optional selector material layer and the phase change material layer can be patterned, for example, by applying and patterning a photoresist layer to mask at least one discrete region, and by performing an anisotropic etch process that forms a pillar structure (16, 14) underneath each patterned discrete portion of the photoresist layer. In one embodiment, an array of pillar structures (14, 16) can be formed. Each pillar structure constitutes a phase change memory cell 180, which is a phase change memory cell.

In case the optional selector material layer is formed, then the pillar structure (14, 16) can include a selector element 14. The selector element 14 is configured to turn on only upon application of a bias voltage thereacross that is greater in magnitude than a threshold voltage. Each pillar structure (14, 16) includes a phase change material portion 16 consisting essentially of the phase change material of the phase change material layer. Each phase change material portion 16 can have a horizontal cross-sectional shape that is invariant with translation along the vertical direction. In this case, each phase change material portion 16 can have at least one vertical sidewall. The horizontal cross-sectional shape of each phase change material portion 16 can be circular, oval, polygonal, or of a curvilinear shape having at least one curve and/or at least one straight line segment. In one embodiment, each phase change material portion 16 can have a circular cylindrical shape. The selector element 14 may be located above or below the phase change material portion 16, and may either contact the phase change material portion 16 or be spaced from the phase change material portion 16 by an intermediate layer, such as by a conductive barrier layer.

According to an aspect of the present disclosure, each phase change material portion 16 can have a ratio of the height to the maximum lateral dimension (e.g., diameter or width) in a range greater than 3.0, and/or greater than 4.0, and/or greater than 5.0, and/or greater than 7.5, and/or greater than 10.0. In one embodiment, the ratio of the height to the maximum lateral dimension for each phase change material portion 16 can be in a range from 3 to 20, such as from 5 to 10. The ratio of the height to the maximum lateral dimension for a phase change material portion 16 is herein referred to as an aspect ratio of the phase change material portion 16.

The maximum on-current of a programming transistor that supplies the programming electrical current to the phase change material portion 16 can be selected such that at least a portion (such as at least one of a top end region, a bottom end region and/or a side region) of the phase change material portion 16 remains polycrystalline during the maximum programming current flow through the phase change material portion 16 during a RESET operation. In one embodiment, programming of the phase change material portion 16 into the high resistivity state (a "RESET" operation) causes only a part of the phase change material portion 16, such as the center region of the phase change material portion 16 to melt while end and/or side region(s) of the phase change material portion 16 remain polycrystalline. For example, the end regions may remain polycrystalline due to the lower temperature in these regions during the RESET operation. Subsequently, the melted region of the phase change material portion 16 is rapidly cooled to form an amorphous phase change material portion, while end and/or side region(s) of the phase change material portion 16 remain polycrystalline. The thickness of the polycrystalline regions may be 1 nm to 5 nm.

Programming of the phase change material portion 16 into the low resistivity state (a "SET" operation) causes the amorphous region (e.g., center region) of the phase change material portion to be heated and then controllably cooled to form a polycrystalline phase change material portion using the polycrystalline regions (e.g., end and/or side regions) as a crystallization template. The crystallization template accelerates crystallization of the amorphous (e.g., center) region of the phase change material portion 16 during the controlled cooldown process, and thus, shortens the programming time for the SET operation. Thus, in this first embodiment, one or more regions of the phase change material portion 16 can be used as a crystallization template for the amorphous region of the phase change material portion 16 during the SET operation.

A dielectric matrix layer 150 can be formed over the first electrode 12. The dielectric matrix layer 150 includes a dielectric material such as undoped silicate glass (e.g., silicon oxide) or a doped silicate glass. The dielectric matrix layer 150 may include a self-planarizing material formed by spin-coating, or may be deposited by a conformal deposition process and subsequently planarized by a planarization process (such as a chemical mechanical planarization process). The top surface of the dielectric matrix layer 150 can be located above the horizontal plane including top surface(s) of the at least one pillar structure (14, 16). The vertical distance between the top surface of the dielectric matrix layer 150 and the top surface(s) of the at least one pillar structure (14, 16) can be in a range from 50 nm to 300 nm, although lesser and greater vertical distances can also be employed.

At least one line trench can be formed through an upper region of the dielectric matrix layer 150 such that a top surface of each pillar structure (14, 16) is physically exposed at the bottom of the at least one line trench. The at least one line trench can laterally extend along a different horizontal direction than the lengthwise direction of the at least one first electrode 12. In one embodiment, each line trench can be perpendicular to the lengthwise direction of the at least one first electrode 12.

At least one conductive material can be deposited in each line trench, and excess portions of the at least one conductive material overlying the horizontal plane including the top surface of the dielectric matrix layer 150 can be removed by a planarization process. Each remaining portion of the at least one conductive material in the at least one line trench constitutes a second electrode 18. For example, the at least one conductive material can include a diffusion barrier material and a metal fill material. In this case, each second electrode 18 can include a combination of a second diffusion barrier liner 184 and a second conductive material rail 182. Each second diffusion barrier liner 184 includes a diffusion barrier material such as a conductive metallic nitride (such as TiN, TaN, and/or WN) and/or a conductive carbon-based material. The thickness of each second diffusion barrier liner 184 can be in a range from 1 nm to 10 nm, such as from 1.5 nm to 5 nm, although lesser and greater thicknesses can also be employed. The second conductive material rail 182 can include a metal such as tungsten or copper. The height of each second electrode 18 can be in a range from 50 nm to 300 nm, although lesser and greater heights can also be employed. In one embodiment, a plurality of second electrodes 18 may be formed as parallel metallic line structures.

Figure 3:
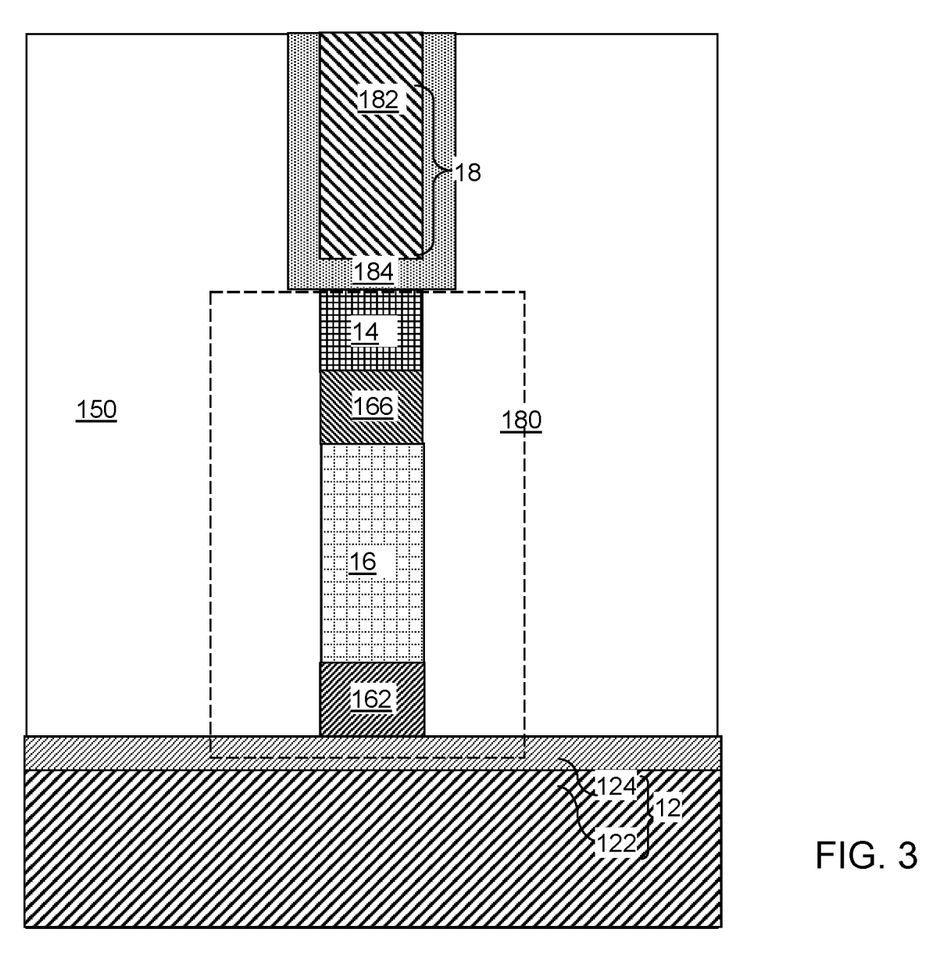
FIG. 3 is a vertical cross-sectional view of a second exemplary phase change memory cell according to an embodiment of the present disclosure.

Referring to FIG. 3, in a second embodiment, a different material from the phase change material portion 16 may be used as a crystallization template. In this embodiment, a second exemplary structure including a phase change memory cell 180 can be derived from the first exemplary structure of FIG. 2 by forming a stack of material layers instead of the phase change material layer used for the first exemplary structure of FIG. 2. Specifically, a layer stack including at least one crystallization template material layer and a phase change material layer contacting the crystallization template material layer are deposited in either order form the second exemplary structure instead of the single phase change material layer. The at least one crystallization template material layer can include a lower crystallization template material layer on which the phase change material layer is deposited, and/or an upper crystallization template material layer which is deposited on the phase change material layer. In one embodiment, the stack of material layers can include a lower crystallization template material layer and a phase change material layer. In another embodiment, the stack of material layers can include a phase change material layer and an upper crystallization template material layer. In yet another embodiment, the stack of material layers can include a lower crystallization template material layer, a phase change material layer, and an upper crystallization template material layer.

The phase change material layer can have the same material composition as the phase change material layer of the first exemplary structure of FIG. 2. In one embodiment, the phase change material of the phase change material layer includes, and/or consists essentially of, a germanium-antimony-telluride compound, such as $Ge_2Sb_2Te_5$. The thickness of the phase change material layer for forming the second exemplary structure can be less than the thickness of the phase change material layer employed to form the first exemplary structure because the second exemplary structure does not rely on the aspect ratio of pillar structures to provide a nucleation template for a phase change material. In one embodiment, the thickness of the phase change material layer for forming the second exemplary structure can be in a range from 6 nm to 300 nm, such as from 20 nm to 150 nm and/or from 40 nm to 100 nm, although lesser and greater thicknesses can also be employed.

Each crystallization template material in the lower crystallization template material layer and/or in the upper crystallization template material layer has a higher melting point or a higher decomposition temperature than the phase change material, such that the template material layer(s) remain crystalline during application of maximum SET and RESET operation current to the memory cell. For example, the crystallization template material should remain crystalline at a temperature of at least 1000 K. In one embodiment, each of the lower crystallization template material layer and the upper crystallization template material layer includes a crystalline conductive material, i.e., a crystalline material having electrical conductivity greater than $1.0 \times 10^2$ S/cm. The crystalline conductive material(s) of the lower crystallization template material layer and the upper crystallization template material layer can be polycrystalline. The thickness of the lower crystallization template material layer, if present, can be in a range from 1 nm to 150 nm, such as from 4 nm to 75 nm and/or from 20 nm to 50 nm, although lesser and greater thicknesses can also be used. The thickness of the upper crystallization template material layer, if present, can be in a range from 1 nm to 150 nm, such as from 4 nm to 75 nm and/or from 20 nm to 50 nm, although lesser and greater thicknesses can also be employed.

A matching lattice spacing (i.e., an inter-layer distance between neighboring lattice planes) between the template material and the phase change material portion 16 can facilitate the crystallization process. The template material may be in the same crystal system, but may, or may not, be in the same space group as the phase change material portion 16. A matching translational symmetry along at least one paired lattice plane with a matching lattice spacing between the template material and the phase change memory material portion 16 can also be sufficient for the template material to facilitate the crystallization process of the phase change material portion. As used herein, a "translational symmetry" refers to a symmetry that a crystal exhibits if translation along one of the crystallographic directions results in a same crystal structure.

Generally, one of the following two conditions is sufficient to provide template-assisted crystallization of a phase change material portion 16. In the first condition, the template material and the phase change material portion 16 can belong to a same crystal system and have matching lattice spacing. In one embodiment of the first condition, the template material and the phase change material portion 16 can have the same crystal system and/or have a matching lattice constant (i.e., a matching lattice spacing of the unit cell). In the second condition, the template material and the phase change material portion 16 do not belong to the same crystal system, but have a matching translational symmetry along at least one paired lattice plane with a matching lattice spacing.

In one embodiment, the crystallization template material belongs to the same crystal system as the phase change material portion 16. A lattice spacing of the crystallization template material also matches the lattice spacing the phase change material portion 16. For $Ge_2Sb_2Te_5$ phase change material, there are two known phases which belong to two crystal systems—the cubic crystal system and the trigonal crystal system. The template material can belong to either of the two crystal systems (i.e., crystal lattice systems) provided that the phase change material portion 16 is in the same crystal system (i.e., crystal lattice system). In one embodiment, the phase change material comprises an alloy of Ge, Sb, and Te having a meta-stable cubic phase in its crystalline state, and the crystallization template material portion belongs to the cubic crystal system in its crystalline state with matching lattice spacing. In another embodiment, the phase change material comprises an alloy of Ge, Sb, and Te having a stable trigonal phase in its crystalline state, and the crystallization template material portion belongs to the trigonal crystal system in its crystalline state with matching lattice spacing.

In one embodiment, the phase change material comprises $Ge_2Sb_2Te_5$ belonging to cubic crystal system with lattice constant of 5.98 Angstrom, or belonging to trigonal crystal system with lattice constant of 4.265 Angstrom when in crystalline state. In this embodiment, the crystallization template material may also have a cubic crystal system or a trigonal crystal system, with a lattice spacing within 7%, such as within 5%, for example zero to 5%, of the lattice constant of 5.98 Angstroms or 4.265 Angstroms of $Ge_2Sb_2Te_5$.

For example, tungsten may be used as the crystallization template material. Tungsten belongs to cubic crystal lattice system (BCC Bravais lattice and Im-3m space group), and has a lattice spacing of 6.328 Angstroms (two times the lattice constant of the unit cell), which is about 105.8% of the lattice constant of $Ge_2Sb_2Te_5$ in the cubic phase. Other suitable crystallization template materials may also be used, such as other crystalline conductive or semiconductor materials different from $Ge_2Sb_2Te_5$ may be used as the crystallization template material. Such materials include elemental metals and metalloids, such as Al, Rh, Pd, Ag, Au, Pt or Sb, and alloys, such as germanium telluride in the trigonal phase, which have lattice spacing or lattice constants between 4.159 and 4.375 Angstrom (i.e., within 3% of the 4.265 Angstrom lattice constant of $Ge_2Sb_2Te_5$ in the trigonal phase). In one embodiment, the crystallization template material may exclude pure elemental silicon.

An optional selector material layer can be deposited under or over the stack of material layers. Subsequently, the optional selector material layer and the stack of the phase change material layer and at least one crystallization template material layer can be patterned in the same manner as used to pattern the pillar structures of the first exemplary structure. At least one pillar structure (162, 16, 166, 14) is formed by patterning the optional selector material layer and the stack of the phase change material layer and at least one crystallization template material layer. Each pillar structure (162, 16, 166, 14) includes a phase change material portion 16, at least one crystallization template material portion (162, 166) in contact with the phase change material portion 16, and optionally a selector element 14. In one embodiment, the pillar structure includes a phase change material portion 16, a lower crystallization template material portion 162 in contact with the phase change material portion 16 and with the first electrode 12, and optionally a selector element 14. In another embodiment, the pillar structure includes a phase change material portion 16, an upper crystallization template material portion 166 in contact with the phase change material portion 16, and optionally a selector element 14. In yet another embodiment, the pillar structure includes a phase change material portion 16, a lower crystallization template material portion 162 in contact with the phase change material portion 16 and with the first electrode 12, an upper crystallization template material portion 166 in contact with the phase change material portion 16, and optionally a selector element 14.

Subsequently, a dielectric matrix layer 150 and at least one second electrode 18 can be formed in the same manner employed to form the first exemplary structure.

Figure 4A:
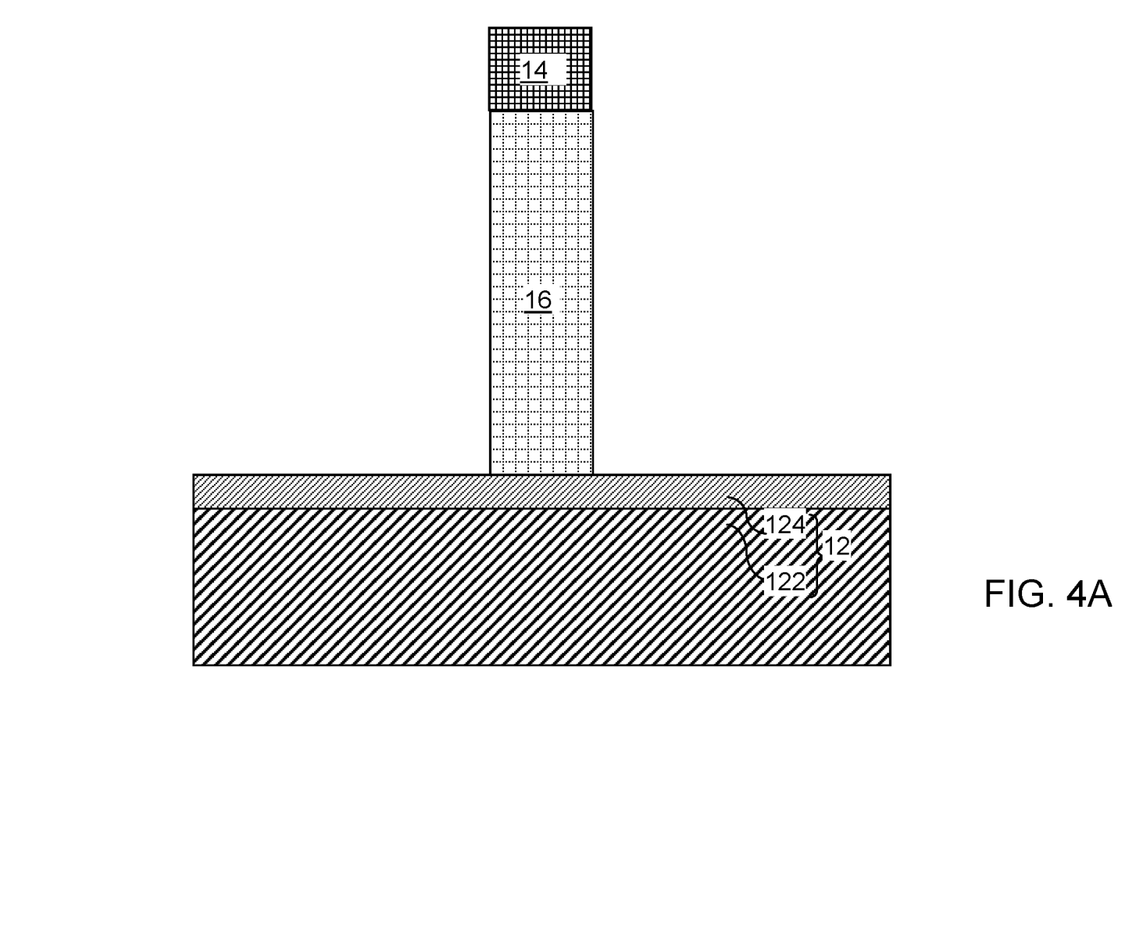
FIGS. 4A, 4B, and 4C are sequential vertical cross-sectional views during manufacture of a third exemplary phase change memory cell according to an embodiment of the present disclosure.

In another aspect of the second embodiment, the crystallization material portion is formed on the sides of the phase change material portion 16 in addition to or instead of the lower and/or upper crystallization material portions (162, 166). Referring to FIG. 4A, a third exemplary structure can be derived from an in-process structure of the first or second exemplary structure. For example, the first exemplary structure after formation of the at least one pillar structure (14, 16) can be used to form the third exemplary structure illustrated in FIG. 4A. The thickness of the phase change material layer for forming the third exemplary structure can be less than the thickness of the phase change material layer employed to form the first exemplary structure because the third exemplary structure does not rely on the aspect ratio of pillar structures to provide a nucleation template for a phase change material. In one embodiment, the thickness of the phase change material layer for forming the third exemplary structure can be in a range from 6 nm to 300 nm, such as from 20 nm to 150 nm and/or from 40 nm to 100 nm, although lesser and greater thicknesses can also be employed.

Figure 4B:
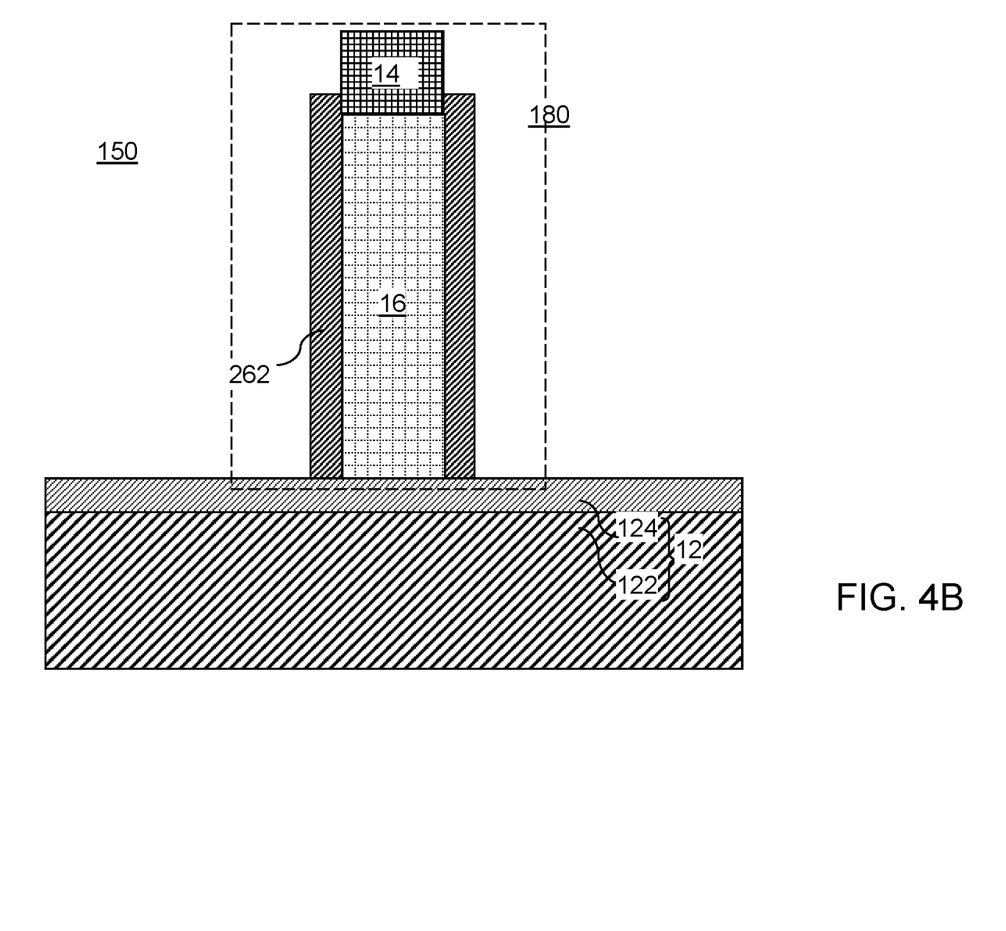

Referring to FIG. 4B, a crystalline dielectric or semiconductor material layer different from GST that can function as a crystallization template material for crystallization of the phase change material can be conformally deposited over the at least one pillar structure (16, 14). In one embodiment, the dielectric material may include crystalline silicon nitride. For example, the alpha phase of silicon nitride belongs to trigonal crystal system and P31c space group, while the gamma phase of silicon nitride has belong to cubic crystal system. Either phase may be used as the crystallization template material. The thickness of the dielectric material layer may be in a range from 2 nm to 20 nm, although lesser and greater thicknesses can also be employed. The dielectric material layer can be formed by a conformal deposition process such as chemical vapor deposition or atomic layer deposition.

In an alternative embodiment, the crystalline dielectric material may include a native oxide formed on GST. The native oxide may comprise germanium oxide, antimony oxide, tellurium oxide, or mixed oxide of two or all three of germanium, antimony and/or tellurium. The native oxide may be formed on the sidewalls and/or the top surface of the phase change material portion 16 by thermal or plasma oxidation of the phase change material portion 16. If the native oxide is formed on the top surface of the phase change material portion 16, then the native oxide is preferably less than 2 nm thick, such as 2 monolayers to 1 nm thick, to avoid significantly increasing the resistivity of the memory cell.

An anisotropic etch that etches horizontal portions of the dielectric or semiconductor material can be performed. Each remaining vertical portion of the dielectric or semiconductor material can have a tubular configuration that laterally surrounds a respective pillar structure (16, 14), and constitutes tubular crystallization template material portion 262. The dielectric or semiconductor material of each tubular crystallization template material portion 262 has a higher melting point or a higher decomposition temperature than the phase change material. Each tubular crystallization template material portion 262 has a tubular configuration, and contacts, and laterally surrounds, a respective phase change material portion 16. The tubular crystallization template material portion 262 may be formed in addition to or instead of the lower and/or upper crystallization template material portions (162, 164).

Figure 4C:
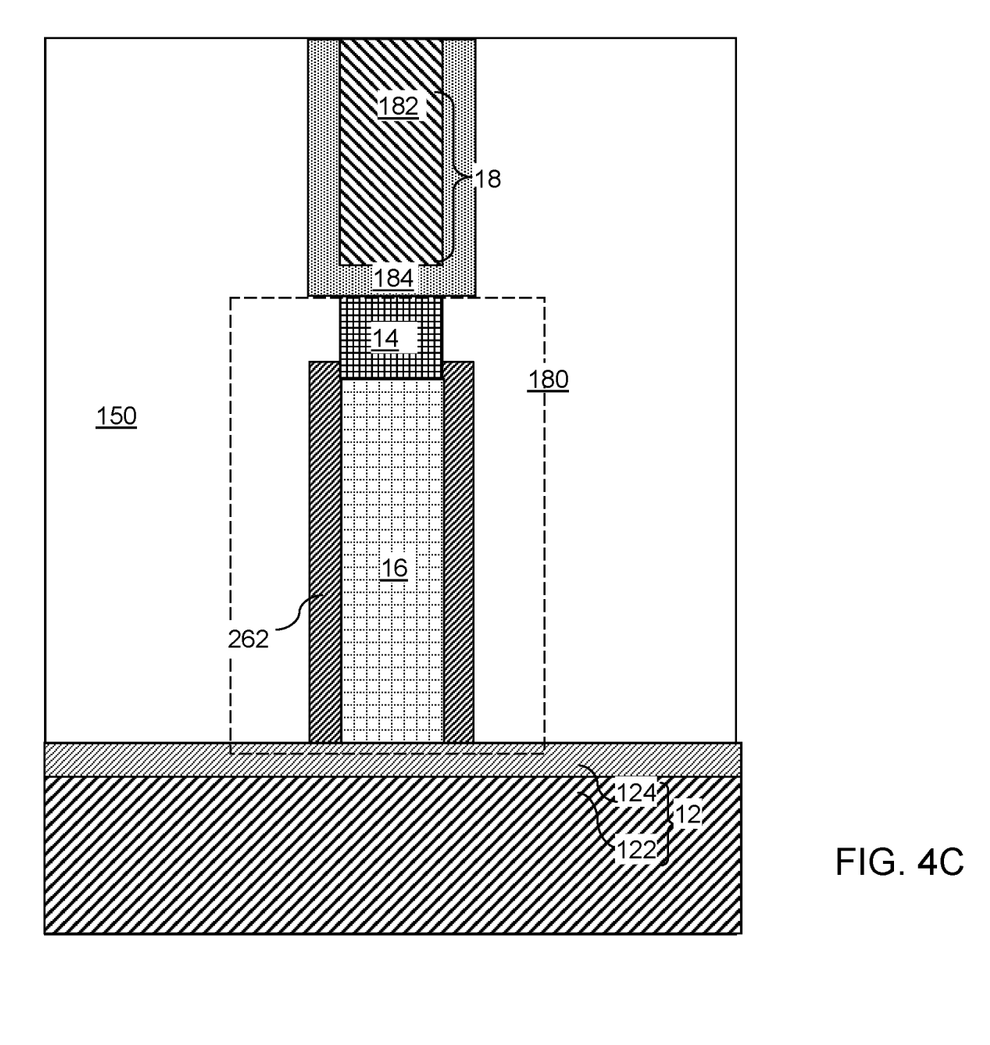

Referring to FIG. 4C, a dielectric matrix layer 150 and at least one second electrode 18 can be formed in the same manner employed to form the first exemplary structure. Each tubular crystallization template material portion 262 can contact a top surface of a first electrode 12, and may contact a bottom surface of the second electrode 18 to be subsequently formed. In one embodiment, an annular end surface of a tubular crystallization template material portion 262 can contact the first electrode 12, and another annular end surface of the tubular crystallization template material portion 262 can contact the second electrode 18. Each phase change memory cell 180 can comprise a selector element 14 configured to turn on only upon application of a bias voltage thereacross that is greater in magnitude than a threshold voltage.

In an alternative embodiment, the dielectric matrix layer 150 may be formed over the first electrode 12, followed by forming openings in the dielectric matrix layer to expose the first electrode 12 or the optional selector element 14 located over the first electrode 12. The tubular crystallization template material portion 262 is them formed in each opening by conformal deposition of the crystallization template material in each opening and anisotropic sidewall spacer etch to leave the tubular crystallization template material portion 262 in each opening. The phase change material portion 16 is then formed on each tubular crystallization template material portion 262 in each opening by deposition of the phase change material followed by CMP or etchback. The second electrode 18 is then formed on the exposed top phase change material portion 16 and the dielectric matrix layer 150.

Figure 5:
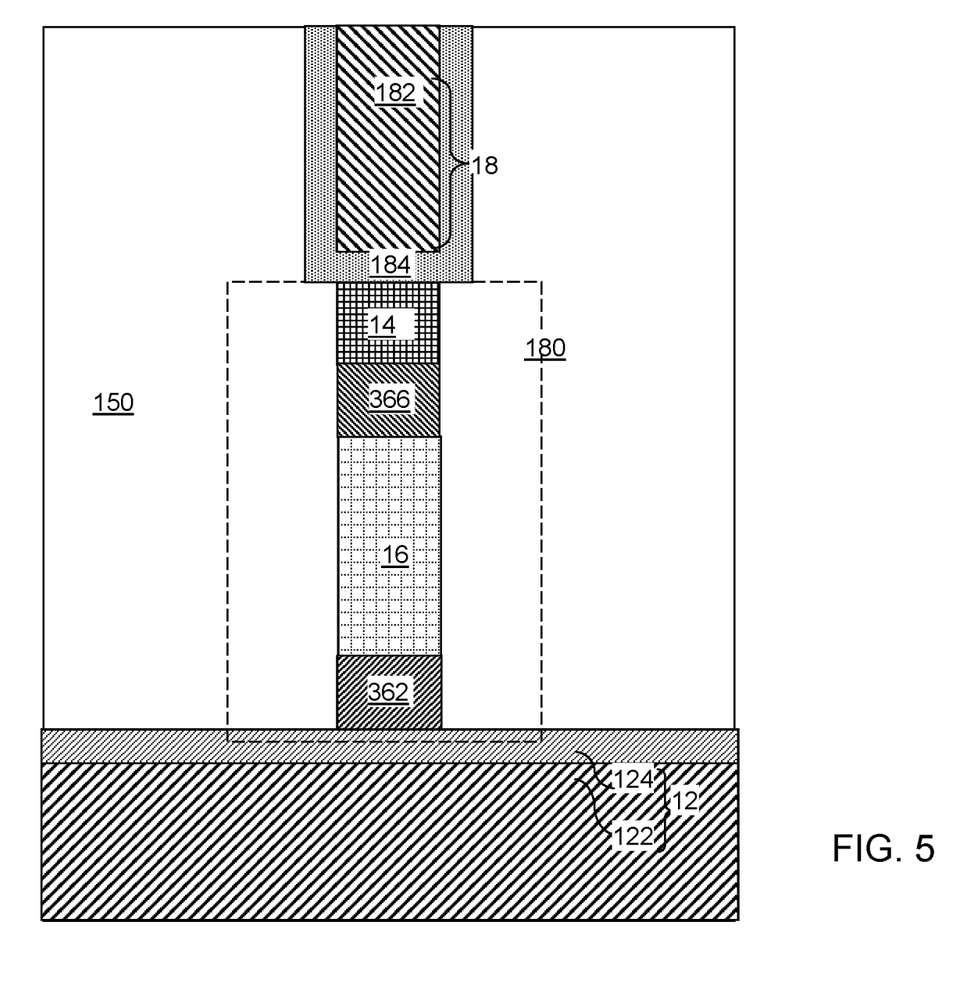
FIG. 5 is a vertical cross-sectional view of a fourth exemplary phase change memory cell according to an embodiment of the present disclosure.

Referring to FIG. 5, in a third embodiment, a GST material having a different composition from the GST phase change material portion 16 may be used as a crystallization template. In this third embodiment, a fourth exemplary structure including at least one phase change memory cell 180 can be derived from the second exemplary structure of FIG. 3 by replacing the lower and/or upper crystallization template material portion (162, 166) with a respective upper and/or lower GST crystallization template material portion (362, 366) having a different composition from the GST phase change material portion.

In this embodiment, GST phase change material portion 16 has a composition of $Ge_2Sb_2Te_5$ or $GeSb_2Te_4$, while the GST crystallization template material is a germanium antimony tellurium compound which has a different composition from that of $Ge_2Sb_2Te_5$ and $GeSb_2Te_4$. Each crystallization template material in the lower crystallization template material portion 362 and/or in the upper crystallization template material portion 366 includes a respective germanium-antimony-tellurium compound material having a higher melting point or a higher decomposition temperature than that of the $Ge_2Sb_2Te_5$ or $GeSb_2Te_4$ material of the phase change material portion 16, such that the GST material of the crystallization template material portion(s) (362, 366) remains crystalline during the maximum current applied during the SET and RESET operations. The germanium-antimony-tellurium compound crystallization template material can have any compositional variation from that of the $Ge_2Sb_2Te_5$ or $GeSb_2Te_4$ material that increases its melting temperature above that of the $Ge_2Sb_2Te_5$ or $GeSb_2Te_4$ material.

In one aspect of the third embodiment, the GST phase change material portion 16 and the GST crystallization template material differ in composition by presence or absence of a dopant species. In one embodiment, the GST phase change material portion 16 can consist essentially of germanium, antimony, and tellurium, (e.g., $Ge_2Sb_2Te_5$ or $GeSb_2Te_4$ material) that lacks intentionally introduced dopants. The GST crystallization template material comprises germanium, antimony, tellurium, and at least one dopant selected from boron, carbon, nitrogen, oxygen, tin, silicon, indium, phosphorous, sulfur, arsenic, selenium, vanadium, and/or titanium. GST crystallization template material of the lower and/or upper crystallization template material portions (362, 366) may include the at least one dopant in a concentration of $1 \times 10^{15}$ cm$^{-3}$ to $5 \times 10^{22}$ cm$^{-3}$. Thus, the GST crystallization template material has a formula $D:Ge_2Sb_2Te_5$ or $D:GeSb_2Te_4$ where D comprises one or more of the above dopants.

In another aspect of the third embodiment, the GST phase change material portion 16 and the GST crystallization template material differ in composition by the ratio of the germanium, antimony and tellurium. In one embodiment, the GST phase change material portion 16 can consist essentially of germanium, antimony, and tellurium in either a 2:2:5 or a 1:2:4 ratio (i.e., a $Ge_2Sb_2Te_5$ or $GeSb_2Te_4$ material). The GST crystallization template material comprises germanium, antimony, and tellurium in a ratio different from a 2:2:5 or a 1:2:4 ratio, such as a $2\pm x:2\pm y:5\pm z$, where $0 \leq x \leq 1$, $0 \leq y \leq 1$, $0 \leq z \leq 1$, where at least one of x, y and z is greater than zero, or $1\pm x:2\pm y:4\pm z$, where $0 \leq x \leq 1$, $0 \leq y \leq 1$, $0 \leq z \leq 1$, where at least one of x, y and z is greater than zero. The GST crystallization template material may or may not be intentionally doped with the above described dopant materials.

The thickness of the lower and upper crystallization template material portions (362, 366) containing the GST template crystallization material can be in a range from 3 nm to 150 nm, such as from 10 nm to 75 nm and/or from 20 nm to 50 nm, although lesser and greater thicknesses can also be employed.

In one embodiment, the lower and upper crystallization template material portions (362, 366) and the phase change material portion 16 can belong to the same crystal system and have matching lattice spacing. In another embodiment, the lower and upper crystallization template material portions (362, 366) and the phase change material portion 16 do not belong to the same crystal system, but have a matching translational symmetry along at least one paired lattice plane with a matching lattice spacing. The optional selector material 14 may also be present in the structure of this third embodiment.

In another aspect of the third embodiment, the above described GST template crystallization material may be formed as the tubular crystallization template material portion 262 described above with respect to FIG. 4C, in addition to or instead of the above described crystallization template material portions (162, 166) or (362, 366).

Referring to all drawings and according to various embodiments of the present disclosure, a phase change memory device, such as the phase change memory cell 180 includes a phase change material portion 16 located between a first electrode 12 and a second electrode 14, and a crystallization template material portion (162, 166, 262, 362 and/or 366) located between the first electrode 12 and the second electrode 18 in contact with the phase change material portion 16. A crystal lattice parameter of the crystallization template material portion (162, 166, 262, 362 and/or 366) is matched to a respective crystal lattice parameter of the phase change material portion 16. Optionally, an selector element 14 may be located between the first electrode 12 and the second electrode 18. The selector element 14 can be an Ovonic threshold switch, tunneling selector, diode, or volatile conductive bridge.

In one embodiment, the crystallization template material portion has a higher melting point or a higher decomposition temperature than the phase change material portion. In one embodiment, at least one of the crystal lattice structure, space group or unit cell lattice constant of the crystallization template material portion is matched to a respective crystal lattice structure, space group or unit cell lattice constant of the phase change material portion. For example, at least two of the crystal lattice structure, space group or unit cell lattice constant of the crystallization template material portion are matched to the respective crystal lattice structure, space group or unit cell lattice constant of the phase change material portion.

In one embodiment, the phase change material comprises $Ge_2Sb_2Te_5$ having a cubic crystal structure in its crystalline state, and the crystallization template material portion has the cubic crystal structure in its crystalline state. In another embodiment, the phase change material comprises $Ge_2Sb_2Te_5$ having a P-3m1 space group having trigonal symmetry in its crystalline state, and the crystallization template material portion has the P-3m1 space group having trigonal symmetry in its crystalline state. In another embodiment, the phase change material comprises $Ge_2Sb_2Te_5$ having a lattice constant of about 4.265 Angstroms and the crystallization template material portion has a lattice constant of within 7%, such as within 5%, of 4.265 Angstroms in its crystalline state.

In one embodiment, the crystallization template material comprises a crystalline conductive or semiconductor material different from silicon or $Ge_2Sb_2Te_5$. For example, the crystallization template material may be selected from W, Al, Rh, Pd, Ag, Au, Pt, Sb or germanium telluride.

In another embodiment, the crystallization template material comprises a dielectric material. In one embodiment, the phase change material comprises germanium antimony telluride, and the crystallization template material comprises a native oxide of the germanium antimony telluride. In another embodiment, the crystallization template material comprises silicon nitride.

In one embodiment, the phase change material portion comprises a first germanium-antimony-tellurium compound; and the crystallization template material portion comprises a second germanium-antimony-tellurium compound that differs in composition from the first germanium-antimony-tellurium compound. In one embodiment, the first germanium-antimony-tellurium compound and the second germanium-antimony-tellurium compound differ in composition by presence or absence of a dopant species. For example, the first germanium-antimony-tellurium compound consists essentially of germanium, antimony, and tellurium, while the second germanium-antimony-tellurium compound comprises germanium, antimony, tellurium, and at least one dopant selected from boron, carbon, nitrogen, oxygen, tin, silicon, indium, phosphorous, sulfur, arsenic, selenium, vanadium, and titanium.

In one embodiment, the crystallization template material portion comprises a dielectric or semiconductor crystallization template material portion having a tubular configuration that laterally surrounds the phase change material portion.

The crystallization template material portions (162, 166, 262, 362, 266) of the embodiments of the present disclosure promote nucleation of the phase change materials. The crystallization template material portions (162, 166, 262, 362, 266) promote a fast and efficient SET operation for phase change memory devices, such as devices having small minimum dimensions.

According to the classic nucleation theory, crystallization of germanium-antimony-telluride phase change materials involves two distinct steps: a nucleation step and a crystal growth step. The nucleation step is a prerequisite for the crystal growth step, especially when the size of a germanium-antimony-telluride phase change material portion is small. Homogeneous nucleation of germanium-antimony-telluride phase change materials occurs within a narrow temperature range. The nucleation rate peaks at about 600 K, and decreases by an order of magnitude below 520 K or above 680 K. However, the growth rate of crystalline grains is at a maximum around 720 K. Heterogeneous nucleation employed in embodiments of the present disclosure, on the other hands, depends on the presence and effectiveness of a crystallization template material which functions as a nucleation template. A key challenge for manufacturing a small-scale phase change memory device has been that nucleation in small phase change material portions becomes increasingly rarer with reduction in the physical dimensions due to reduction in the material volume (homogeneous nucleation probability is proportional to volume) and the absence of heterogeneous nucleation template. Promotion of nucleation enhances the efficiency for crystallization during a SET operation in small phase change memory devices, such as those having a smallest dimension smaller than 80 nm.

An advantage of the phase change memory devices of the embodiments of the present disclosure is that write current efficiency and data storage retention can be simultaneously improved. In other words, a SET operation can be effectively performed without compromising data retention. A large read current may be employed without disturbing the memory state of the phase change memory cells 180. The impact of snapback currents on read is reduced, removing the need for compensation circuitry or write-after-read to eliminate its effect. This advantage can useful in phase change memory devices employing frequent data write/erase applications where long-term data retention is not a necessity.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:
1. A phase change memory device, comprising:
   a phase change material portion located between a first electrode and a second electrode; and
   a crystallization template material portion located between the first electrode and the second electrode in contact with the phase change material portion,
   wherein:
   (i) the crystallization template material portion and the phase change material portion belong to a same crystal system and have matching lattice spacing; or
   (ii) the crystallization template material portion and the phase change material portion do not belong to the same crystal system, but have a matching translational symmetry along at least one paired lattice plane with a matching lattice spacing.
2. The phase change memory device of claim 1, wherein the crystallization template material portion has a higher melting point or a higher decomposition temperature than the phase change material portion.
3. The phase change memory device of claim 1, wherein the crystallization template material portion and the phase change material portion belong to the same crystal system and have the matching lattice spacing.
4. The phase change memory device of claim 3, wherein the crystallization template material portion lattice spacing is within 7% of a lattice constant of the phase change material portion.
5. The phase change memory device of claim 3, wherein the phase change material comprises an alloy of Ge, Sb, and Te having a meta-stable cubic phase in its crystalline state, and the crystallization template material portion belongs to a cubic crystal system in its crystalline state.
6. The phase change memory device of claim 3, wherein the phase change material comprises an alloy of Ge, Sb, and Te having a stable trigonal phase in its crystalline state, and the crystallization template material portion belongs to trigonal crystal system in its crystalline state.
7. The phase change memory device of claim 3, wherein the phase change material and the crystallization template material have matching translational symmetry along at least one paired lattice plane with matching lattice spacing.
8. The phase change memory device of claim 1, wherein the phase change material comprises Ge2Sb2Te5, and the crystallization template material comprises a crystalline conductive or semiconductor material different from silicon or Ge2Sb2Te5.
9. The phase change memory device of claim 8, wherein the crystallization template material is selected from W, Al, Rh, Pd, Ag, Au, Pt, Sb or germanium telluride.
10. The phase change memory device of claim 1, wherein the crystallization template material comprises a dielectric material.

11. The phase change memory device of claim 10, wherein the phase change material comprises germanium antimony telluride, and the crystallization template material comprises a native oxide of the germanium antimony telluride.

12. The phase change memory device of claim 10, wherein the crystallization template material comprises silicon nitride.

13. The phase change memory device of claim 1, wherein:
the phase change material portion comprises a first germanium-antimony-tellurium compound; and
the crystallization template material portion comprises a second germanium-antimony-tellurium compound that differs in composition from the first germanium-antimony-tellurium compound.

14. The phase change memory device of claim 13, wherein the first germanium-antimony-tellurium compound and the second germanium-antimony-tellurium compound differ in composition by presence or absence of a dopant species.

15. The phase change memory device of claim 14, wherein:
the first germanium-antimony-tellurium compound consists essentially of germanium, antimony, and tellurium; and
the second germanium-antimony-tellurium compound comprises germanium, antimony, tellurium, and at least one dopant selected from boron, carbon, nitrogen, oxygen, tin, silicon, indium, phosphorous, sulfur, arsenic, selenium, vanadium, or titanium.

16. The phase change memory device of claim 1, wherein the crystallization template material portion comprises a dielectric or semiconductor crystallization template material portion having a tubular configuration that laterally surrounds the phase change material portion.

17. The phase change memory device of claim 1, further comprising an Ovonic threshold selector element located between the first and the second electrodes.

18. A method of forming a phase change memory device, comprising:
forming a first electrode comprising a first conductive material;
forming a pillar structure including combination of a phase change material portion comprising a phase change material and a crystallization template material portion in contact with the phase change material portion on the first electrode, wherein the crystallization template material portion comprises a crystallization template material having a higher melting point or a higher decomposition temperature than the phase change material;
forming a dielectric matrix layer over the first electrode and around the pillar structure; and
forming a second electrode over the pillar structure;
wherein the phase change material portion comprises germanium antimony telluride, and the crystallization template material comprises a native oxide of the germanium antimony telluride formed by oxidizing the phase change material portion to form the crystallization template material portion having a tubular shape which surrounds the phase change material portion.

* * * * *